United States Patent
Liu et al.

(10) Patent No.: US 11,629,392 B2
(45) Date of Patent: Apr. 18, 2023

(54) TICB—AL SEED ALLOY, MANUFACTURING METHOD THEREOF AND HERITABLE ALUMINUM ALLOY

(71) Applicants: SHANDONG UNIVERSITY, Jinan (CN); SHANDONG MAIAOJING NEW MATERIALS COMPANY LIMITED, Linyi (CN); SHANDONG AL&MG MELT TECHNOLOGY COMPANY LIMITED, Jinan (CN)

(72) Inventors: Xiangfa Liu, Jinan (CN); Jinfeng Nie, Linyi (CN); Qianqian Sun, Jinan (CN); Guiliang Liu, Linyi (CN); Mengxia Han, Jinan (CN)

(73) Assignees: SHANDONG UNIVERSITY, Shandong (CN); SHANDONG MAIAOJING NEW MATERIALS COMPANY LIMITED, Shandong (CN); SHANDONG AL&MG MELT TECHNOLOGY COMPANY LIMTTED, Shandong (CN)

( * ) Notice: Subject to any disclaimer, the term of this patent is extended or adjusted under 35 U.S.C. 154(b) by 164 days.

(21) Appl. No.: 17/130,082

(22) Filed: Dec. 22, 2020

(65) Prior Publication Data
US 2022/0056558 A1      Feb. 24, 2022

(30) Foreign Application Priority Data
Aug. 24, 2020   (CN) .......................... 202010858874.6

(51) Int. Cl.
C22C 1/02        (2006.01)
C22C 14/00       (2006.01)
(Continued)

(52) U.S. Cl.
CPC ............ *C22C 14/00* (2013.01); *C22C 1/1068* (2013.01); *C22C 21/02* (2013.01); *C22C 21/10* (2013.01);
(Continued)

(58) Field of Classification Search
CPC ....................................................... C22C 21/02
See application file for complete search history.

(56) References Cited

U.S. PATENT DOCUMENTS

2016/0273075 A1*   9/2016   Wang ...................... C22B 21/06
2020/0269318 A1*   8/2020   Cramer ............... C04B 41/5155

OTHER PUBLICATIONS

Tian, Wenjie, et al. "Transformation from Al3BC phase to doped TiB2 orTiC particles in Al—Ti melts." Journal of alloys and compounds 561 (2013): 48-53.*
(Continued)

*Primary Examiner* — Christopher S Kessler
(74) *Attorney, Agent, or Firm* — Novick, Kim & Lee, PLLC; Allen Xue

(57) ABSTRACT

The present disclosure provides a TiCB—Al seed alloy, a manufacturing method thereof and a heritable aluminum alloy. The TiCB—Al seed alloy includes an Al matrix and $TiC_B$@TiBC seed crystals dispersed on the Al matrix, wherein the $TiC_B$@TiBC seed crystal comprises a core part and a shell part, the core part contains B-doped $TiC_B$, and the shell part covers at least a part of the core part and contains a TiBC ternary phase, wherein the B-doped $TiC_B$ refers to a $TiC_B$ phase formed by B atoms occupying C vacancies in a $TiC_x$ crystal, and the TiBC ternary phase refers to a ternary phase composed of Ti, B and C, wherein x<1.

17 Claims, 10 Drawing Sheets
(1 of 10 Drawing Sheet(s) Filed in Color)

(51) Int. Cl.
    *C22C 1/10*     (2023.01)
    *C22C 21/02*     (2006.01)
    *C22C 21/10*     (2006.01)
    *C30B 29/52*     (2006.01)

(52) U.S. Cl.
    CPC .......... *C30B 29/52* (2013.01); *C22C 1/1047* (2023.01); *C22C 1/1073* (2023.01)

(56) References Cited

OTHER PUBLICATIONS

Li, Pengting, et al. "Grain refinement of A356 alloy by Al—Ti—B—C master alloy and its effect on mechanical properties." Materials & Design 47 (2013): 522-528.*

Zhang, Guo-Jun et al, "Influence of Anti Zr-poisioning Al—Ti—B—C Master Alloy on Mechanical Properties of 7050 Aluminum Alloy" Journal of Materials Engineering, Dec. 2017, vol. 45, No. 4, pp. 1-8, China.

Zhang, Lili et al, "Grain Refinement Performance of Al—3Ti—1B—0.2C Master Alloy on A356 Alloy" China Academic Journal Electronic Publishing House, Dec. 2011, pp. 576-579, vol. 31.

* cited by examiner

TICB—AL SEED ALLOY, MANUFACTURING METHOD THEREOF AND HERITABLE ALUMINUM ALLOY

TECHNICAL FIELD

The present disclosure relates to a field of metal materials, and particularly relates to a TiCB—Al seed alloy, a manufacturing method thereof and a heritable aluminum alloy.

BACKGROUND

High strength and ultra-high strength aluminum alloys have broad application prospects in aerospace, transportation, 5G communication and other fields due to their strength advantages. For example, 7050 ultra-high strength aluminum alloy has replaced steel to occupy a dominant position in current aviation materials, and a rail transit field entering a period of rapid development has also shown a strong demand trend for this alloy. In addition, aluminum alloy parts have now become the first choice in an automobile industry, such as engine cylinder block, cylinder head, piston, connecting rod, wheel, cover and shell parts, etc., of which more than 70% are Al—Si series alloy (such as A356, ZL109, ZL114, ADC12, etc.) castings. In addition, the demand for aluminum alloy parts has a large increase space and an added value of products is high.

However, the high strength and ultra-high strength aluminum alloys have poor plastic toughness, poor processability and high reject (defect) rate, which is mainly caused by coarse primary crystal α-Al dendrite. Grain refinement of α-Al can improve its comprehensive mechanical properties and yield. However, traditional commercial refiners such as Al—Ti—B or Al—Ti—C master alloy are easy to react irreversibly with strengthening elements such as Zr, Si and the like in aluminum alloy after being added into aluminum melt, making grain refinement ineffective, which is called refinement "poisoning" phenomenon. This phenomenon involves many alloys, has a great influence on the properties of the alloys and is difficult to solve. For example, the refinement "poisoning" of 7XXX series aluminum alloy caused by Zr element leads to coarse grains of the semi-continuous casting blank, resulting in casting defects such as macrosegregation, shrinkage porosity, hot cracking, etc., accompanied by bright crystals, feathery crystals, uneven microstructure and properties, and also increasing the anisotropy of the casting blank, resulting in poor deformation capacity, which is not conducive to subsequent plastic processing. Refinement "poisoning" caused by Si element in Al—Si series alloy leads to that α-Al dendrite or eutectic cluster are abnormally coarse, which leads to many defects such as component segregation, snowflake spot, shrinkage porosity, shrinkage pores and the like of castings, and significantly reduces the strength and toughness, fatigue properties, microstructure compactness, microstructure uniformity and product consistency of castings.

At present, aluminum processing enterprises have adopted two methods in their production to reluctantly deal with the problem of refinement "poisoning". One is to increase an addition amount of refiner, which solves the problem of grain refinement in a certain extent, but it brings new problems. Excessive Ti reacts with Zr and Si elements to generate phase of coarse plates, thus reducing the product quality and deteriorating mechanical properties of the alloy. In addition, excessive Ti is not conducive to recycling of recycled materials, and abandoning the recycled materials not only increases the production cost, but also does not conform to the green and sustainable development strategy. The second is to shorten the "poisoning" reaction time, Al—Ti—B and other refiner filaments are pre-placed in the mold, dissolved in the pouring process and quickly entered the solidification stage, but it is difficult to ensure an effective dissolution and uniform function of the refiner, resulting in an increase in rejection rate.

In addition, although many researchers have also done a lot of research work on how to solve the problem of refinement "poisoning" (such as developing new refiners, improving existing refiners, microalloying design, etc.), there are still some technical problems such as high cost, changing alloy composition, poor and unstable effect or contrary to a technology of a production site.

In addition, the refinement effect of the existing refiners such as Al—Ti—B is easy to degrade, that is, when the heat preservation time is long, the existing refiners will lose its refinement effect, resulting in the coarsening of α-Al.

SUMMARY

In accordance with an aspect of the present disclosure, a TiCB—Al seed alloy is provided, the TiCB—Al seed alloy includes an Al matrix and $TiC_B$@TiBC seed crystals dispersed on the Al matrix, wherein the $TiC_B$@TiBC seed crystal comprises a core part and a shell part, the core part contains B-doped $TiC_B$, and the shell part covers at least a part of the core part and contains a TiBC ternary phase, wherein the B-doped $TiC_B$ refers to a $TiC_B$ phase formed by B atoms occupying C vacancies in a $TiC_x$ crystal, and the TiBC ternary phase refers to a ternary phase composed of Ti, B and C, wherein x<1.

Alternatively, a content of C in the core part may be higher than a content of C in the shell part, and a content of B in the core part may be lower than a content of B in the shell part.

Alternatively, the B-doped $TiC_B$ may be represented by $TiC_xB_y$, wherein $0.72<x<0.81$, and $0<y<0.17$.

Alternatively, a content of the $TiC_B$@TiBC seed crystal may be 0.08 wt % to 10.24 wt % based on 100 wt % of the TiCB—Al seed alloy.

Alternatively, a content of Ti may be 0.06 wt % to 7.77 wt %, a content of C may be 0.01 wt % to 1.30 wt %, and a content of B may be 0.01 wt % to 1.17 wt % based on 100 wt % of the TiCB—Al seed alloy.

Alternatively, a morphology of the $TiC_B$@TiBC seed crystal is different from those of a hexagonal sheet-like $TiB_2$ crystal and an octahedral-like or tetrahedral-like $TiC_x$ crystal.

Alternatively, the $TiC_B$@TiBC seed crystal is generally spherical and a diameter of the $TiC_B$@TiBC seed crystal is between 50 nm and 800 nm.

According to another aspect of the present disclosure, a TiCB—Al seed alloy is provided, the TiCB—Al seed alloy includes an Al matrix and a plurality of particles dispersed on the Al matrix, wherein each of the plurality of particles comprises a core part and a shell part covering at least a portion of the core part, and wherein a content of C in the core part is higher than a content of C in the shell part, and a content of B in the core part is lower than a content of B in the shell part.

According to another aspect of the present disclosure, there is provided a method of manufacturing a TiCB—Al seed alloy which includes (1) preparing 0.64 wt % to 75.00 wt % of an Al—Al$_3$BC master alloy, 0.06 wt % to 7.77 wt % of a sponge titanium, and a balance of a commercial-purity aluminum, wherein a content of Al$_3$BC in the Al—Al$_3$BC master alloy is 3.0 wt % to 15.0 wt % of a total weight of the Al—Al$_3$BC master alloy; (2) melting the commercial-purity aluminum and the Al—Al$_3$BC master alloy and heating to 850° C. to 1300° C.; (3) adding the sponge titanium, and holding for 5 min to 60 min after the sponge titanium being dissolved to obtain a melt; and (4) pouring the melt to obtain the TiCB—Al seed alloy described above.

According to another aspect of the present disclosure, a heritable aluminum alloy is provide, the heritable aluminum alloy includes α-Al and TiC$_B$@TiBC seed crystals using as seed crystals of α-Al and including a core part and a shell part, wherein the core part contains a B-doped TiC$_B$, and the shell part covers at least a part of the core part and contains a TiBC ternary phase, and wherein the B-doped TiC$_B$ refers to TiC$_B$ phase formed by B atoms occupying C vacancies in a TiC$_x$ crystal, and the TiBC ternary phase refers to a ternary phase composed of Ti, B, and C, where x<1.

Alternatively, a content of the TiC$_B$@TiBC seed crystal may be 0.001 wt % to 5.120 wt % based on 100 wt % of the heritable aluminum alloy. The heritable aluminum alloy may be a heritable Al—Zn series alloy, and a content of Al may be 60.0 wt %-98.9 wt %, a content of Zn may be 1.0 wt %-10.0 wt %, and a content of Zr may be 0.0 wt %-0.8 wt % based on 100 wt % of the heritable Al—Zn series alloy. Or, the heritable aluminum alloy may be a heritable Al—Si series alloy, and a content of Al may be 60.0 wt %-99.5 wt %, and a content of Si may be 0.4 wt %-13.0 wt % based on 100 wt % of the heritable Al—Si series alloy.

Alternatively, an average grain size of α-Al in the heritable Al—Zn series alloy measured by a TP-1 standard method may be between 20 μm and 150 μm, and an average grain size of α-Al in the heritable Al—Si series alloy measured by a KBI ring mold method or the TP-1 standard method may be between 35 μm and 250 μm.

Alternatively, an average grain size of α-Al in a casting obtained after remelting the heritable Al—Zn series alloy may be smaller than the average grain size of α-Al in the heritable Al—Zn series alloy before remelting, and an average grain size of α-Al in a casting obtained after remelting the heritable Al—Si series alloy may be smaller than the average grain size of α-Al in the heritable Al—Si series alloy before remelting.

Alternatively, the average grain size of α-Al in the casting obtained by remelting the heritable Al—Zn series alloy at 700° C. to 820° C. and holding for 15 min to 100 min may be between 5 μm and 150 μm, and the average grain size of α-Al in the casting obtained after remelting the heritable Al—Si series alloy at 680° C. to 820° C. and holding for 15 min to 180 min may be between 5 μm and 200 μm.

The TiCB—Al seed alloy according to the present disclosure has low cost, has excellent and stable refinement effect and is easy to be applied to a production site.

The TiCB—Al seed alloy according to the present disclosure can solve the technical problem that the existing aluminum alloy refiner is prone to occur refinement "poisoning" caused by Zr and Si, can realize efficient refinement of Zr-containing or Si-containing aluminum alloy without degradation, and the fine grain structure of the refined aluminum alloy can be inherited after remelting.

When the heritable aluminum alloy according to the present disclosure is applied to industrial production, it is only need to remelt the heritable aluminum alloy of the present disclosure and it is not need to add a refiner or perform a melt treatment technology related to grain refinement, and a casting obtained by remelting the heritable aluminum alloy of the present disclosure can obtain an ultra-fine grain structure, and thus the heritable aluminum alloy of the present disclosure can be simply and efficiently applied to industrial production.

BRIEF DESCRIPTION OF DRAWINGS

The patent or application file contains at least one drawing/photograph executed in color. Copies of this patent or patent application with color drawing(s)/photograph(s) will be provided by the Office upon request and payment of the necessary fee.

The above and other aspects, features, and other advantages of the present disclosure will be more clearly understood from the following detailed description taken in conjunction with the accompanying drawings, in which.

DETAILED DESCRIPTION

Hereinafter, embodiments of the present disclosure will be described below with reference to the accompanying drawings.

However, the present disclosure may be exemplified in many different forms and should not be construed as limited to the specific embodiments set forth herein. More specifically, these embodiments are provided so that the disclosure will be thorough and complete, and the scope of the present disclosure will be fully convey to those skilled in the art.

It should be understood that when the terms "include(s)" and/or "contain(s)" are used in the specification, they list the presence of the stated materials and/or ingredients, but do not exclude the presence or addition of one or more other materials and/or ingredients.

A TiCB—Al Seed Alloy

Hereinafter, a TiCB—Al seed alloy according to an embodiment of the present disclosure is described with reference to FIG. 1.

The TiCB—Al seed alloy according to the embodiment of the present disclosure includes an Al matrix and $TiC_B$@TiBC seed crystals dispersed on the Al matrix, the $TiC_B$@TiBC seed crystal comprises a core part and a shell part, wherein the core part contains B-doped $TiC_B$, and the shell part covers at least a part of the core part and contains a TiBC ternary phase, wherein the B-doped $TiC_B$ refers to a $TiC_B$ phase formed by B atoms occupying C vacancies in a $TiC_x$ crystal, and the TiBC ternary phase refers to a ternary phase composed of Ti, B and C, wherein x<1.

Figure 1A:
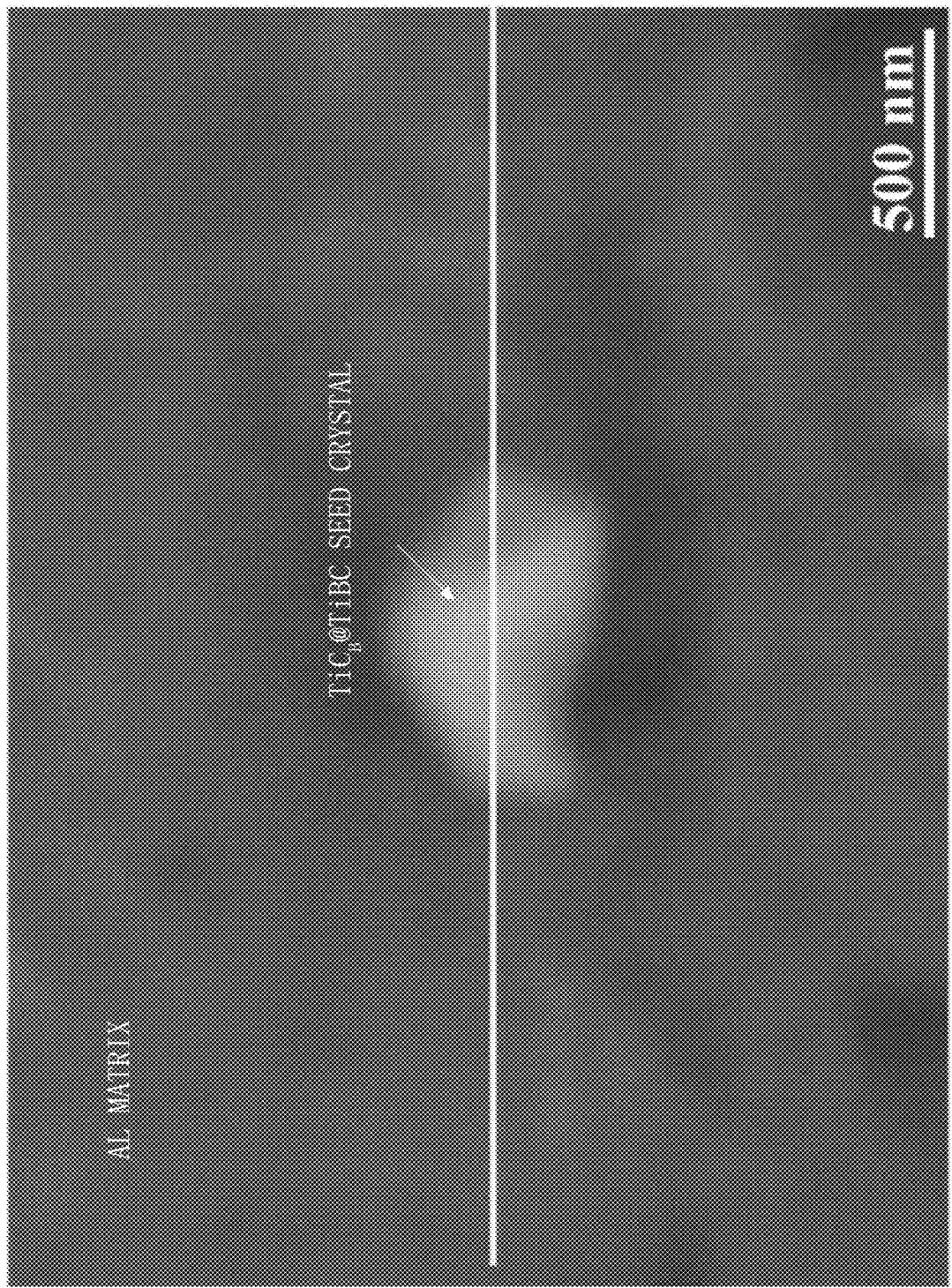
FIGS. 1A and 1B are electron probe elemental analyses of a TiC$_B$@TiBC seed crystal according to an embodiment of the present disclosure.
Figure 1B:
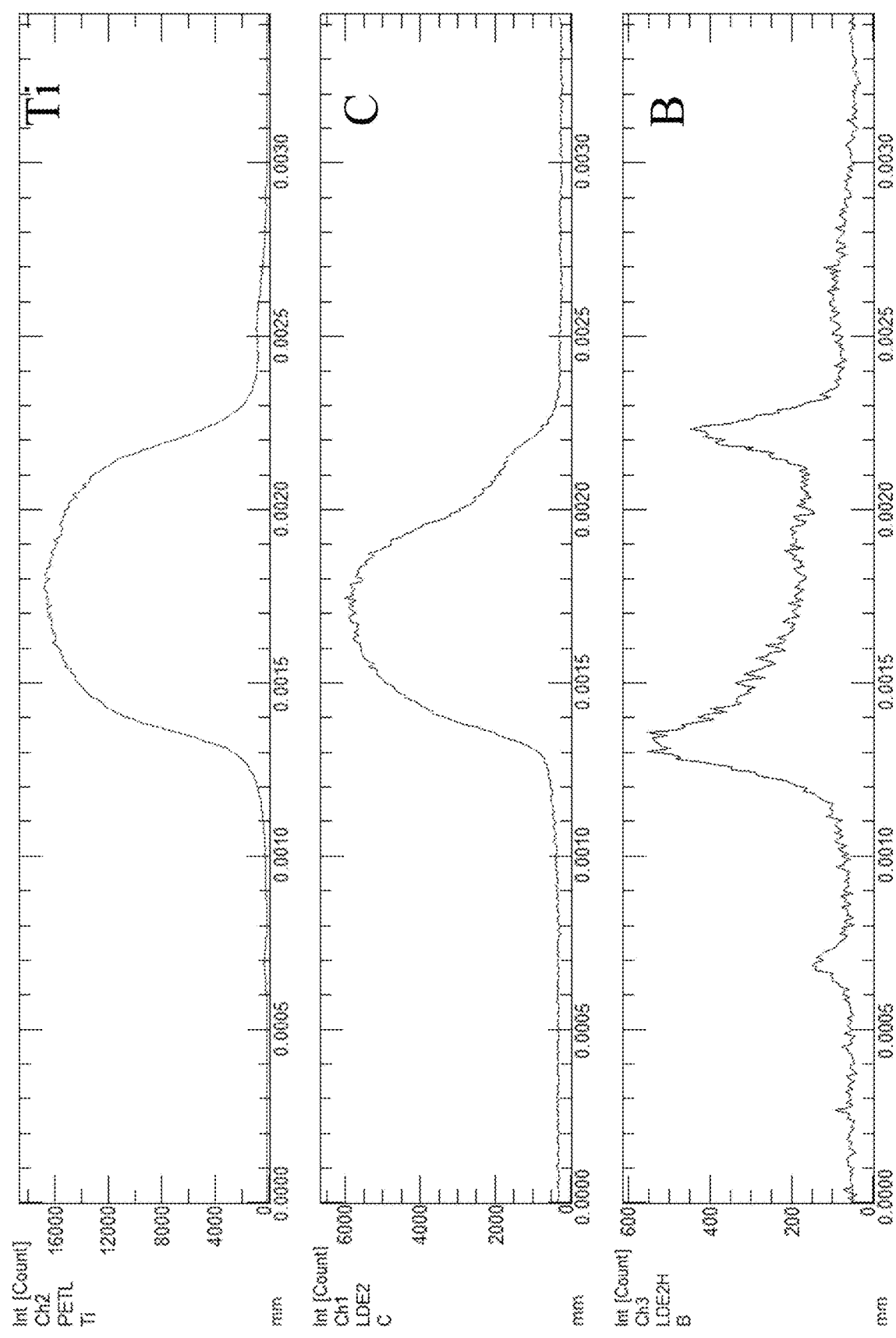

FIGS. 1A and 1B show the composition analysis of the $TiC_B$@TiBC seed crystal in the TiCB—Al seed alloy using a field emission scanning electron microscope, and FIG. 1B is a line scan analysis along a white line in FIG. 1A, which shows changes in contents of Ti, C and B elements according to positions.

As shown in FIG. 1A, the TiCB—Al seed alloy includes an Al matrix and a particle dispersed on the Al matrix. As shown in FIG. 1B, by electron probe elemental analysis of the particle, it can be seen that the particle contains three elements of Ti, C and B.

In addition, it can be seen from FIG. 1B that a change trend of a content of C is generally opposite to a change trend of a content of B from an outside to an inside of the particle. For example, in the periphery of the particle, the content of C element is small, while the content of B element is high, even reaching a peak level. However, in the interior of the particle, the content of C element is high, even reaching a peak level, while the content of B element is small. That is, the content of C in the core part is higher than the content of C in the shell part, while the content of B in the core part is lower than the content of B in the shell part.

This shows that the core part of the particle contains B-doped $TiC_B$, which refers to the $TiC_B$ phase formed by B atoms occupying the C vacancy of $TiC_x$ (x<1 due to the presence of C vacancy in $TiC_x$) crystal. The shell part of the particle contains TiBC ternary phase, which refers to the ternary phase composed of Ti, B and C. Therefore, the TiCB—Al seed alloy according to embodiments of the present disclosure includes $TiC_B$@TiBC (core@shell) seed crystals.

It should be understood that the B-doped $TiC_B$ and TiBC ternary phases are two completely different phases. B-doped $TiC_B$ is formed by B atoms occupying C vacancies in the $TiC_x$ crystal, and thus the B-doped $TiC_B$ still retains the crystal structure of the $TiC_x$ crystal. However, the TiBC ternary phase is a ternary phase composed of Ti, B and C, which does not have the crystal structure of $TiC_x$, and thus it is different from crystal structure of $TiC_B$.

According to an embodiment of the present invention, the B-doped $TiC_B$ may be represented by $TiC_xB_y$, where 0.72<x<0.81, 0<y<0.17. Generally, a range of x in $TiC_x$ prepared according to a melt method satisfies 0.72<x<0.81. In addition, considering a maximum doping amount of B without destroying a lattice structure of $TiC_x$, y according to the embodiment of the present disclosure satisfies 0<y<0.17.

It should be understood that the present disclosure is only intended to prove the core-shell structure of the $TiC_B$@TiBC seed crystal through FIG. 1B, and is not intended to define a doping amount of B in the B-doped $TiC_B$ in the present disclosure and a content of Ti, B and C in the TiBC ternary phase. In fact, even in TiCB—Al seed alloys with the same composition, for different $TiC_B$@TiBC seed crystals, the doping amounts of B in $TiC_B$ may be different and the contents of Ti, B and C in the TiBC ternary phase may be different.

According to the embodiment of the present disclosure, the content of the $TiC_B$@TiBC seed crystals may be 0.08 wt % to 10.24 wt % based on 100 wt % of the TiCB—Al seed alloy. Alternatively, based on 100 wt % of the TiCB—Al seed alloy, the content of the $TiC_B$@TiBC seed crystals may be 0.26 wt % to 2.90 wt %. Alternatively, based on 100 wt % of the TiCB—Al seed alloy, the content of the $TiC_B$@TiBC seed crystals may be 1.12 wt % to 4.62 wt %. Alternatively, based on 100 wt % of the TiCB—Al seed alloy, the content of the $TiC_B$@TiBC seed crystals may be 4.62 wt % to 10.24 wt %.

In addition, according to the embodiment of the present disclosure, in the TiCB—Al seed alloy, based on 100 wt % of the TiCB—Al seed alloy, the content of Ti may be 0.06 wt % to 7.77 wt %, the content of C may be 0.01 wt % to 1.30 wt %, and the content of B may be 0.01 wt % to 1.17 wt %.

Alternatively, based on 100 wt % of the TiCB—Al seed alloy, the content of Ti may be 0.2 wt % to 2.20 wt %, the content of C may be 0.03 wt % to 0.37 wt %, and the content of B may be 0.03 wt % to 0.33 wt %. Alternatively, based on 100 wt % of the TiCB—Al seed alloy, the content of Ti may be 0.85 wt % to 3.5 wt %, the content of C may be 0.14 wt % to 0.59 wt %, and the content of B may be 0.13 wt % to 0.53 wt %. Alternatively, based on 100 wt % of the TiCB—Al seed alloy, the content of Ti may be 3.50 wt % to 7.77 wt %, the content of C may be 0.59 wt % to 1.30 wt %, and the content of B may be 0.53 wt % to 1.17 wt %.

According to an embodiment of the present disclosure, as shown in FIG. 1A, the morphology of the $TiC_B$@TiBC seed crystal is different from that of a hexagonal plate-like $TiB_2$ crystal and a octahedral-like or tetrahedral-like $TiC_x$ crystal. The $TiC_B$@TiBC seed crystal may be generally spherical (not perfect spherical) and have no obvious edges and corners.

In addition, as shown in FIG. 1A, a diameter of the $TiC_B$@TiBC seed crystal is between 50 nm and 800 nm, and the $TiC_B$@TiBC seed crystals are dispersed on the aluminum substrate. "The diameter of the $TiC_B$@TiBC seed is between 50 nm and 800 nm" means that both of the maximum diameter and the minimum diameter of each of the TiCB@TiBC seed crystals in the TiCB—Al seed alloy are within the above range and does not exceed the above range.

Figure 1C:
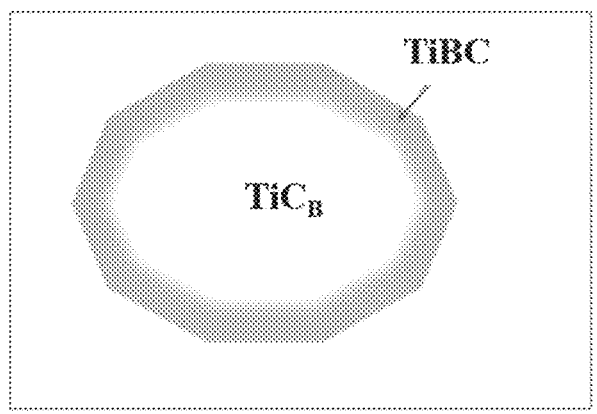
FIG. 1C is a model diagram illustrating the TiC$_B$@TiBC seed crystal according to the embodiment of the present disclosure.

FIG. 1C schematically illustrates a model diagram of a $TiC_B$@TiBC seed crystal according to an embodiment of the present disclosure. As can be seen from FIG. 1C, the $TiC_B$@TiBC seed crystal comprises a core part and a shell part, the core part contains a B-doped $TiC_B$, and the shell part contains a TiBC ternary phase. It should be understood that FIG. 1C only schematically shows the core@shell structure of the $TiC_B$@TiBC seed crystal, and the size and proportion of the core part and shell part are not limited by the model of FIG. 1C. In addition, the morphology of the $TiC_B$@TiBC seed crystal is not limited by the model of FIG. 1C.

It should be understood that in FIG. 1C, the shell part of the $TiC_B$@TiBC seed crystal completely coats the core part. However, the present disclosure is not limited thereto, and the shell part of the $TiC_B$@TiBC seed crystal may only coat a portion of the core part.

Figures 2A, 2B:
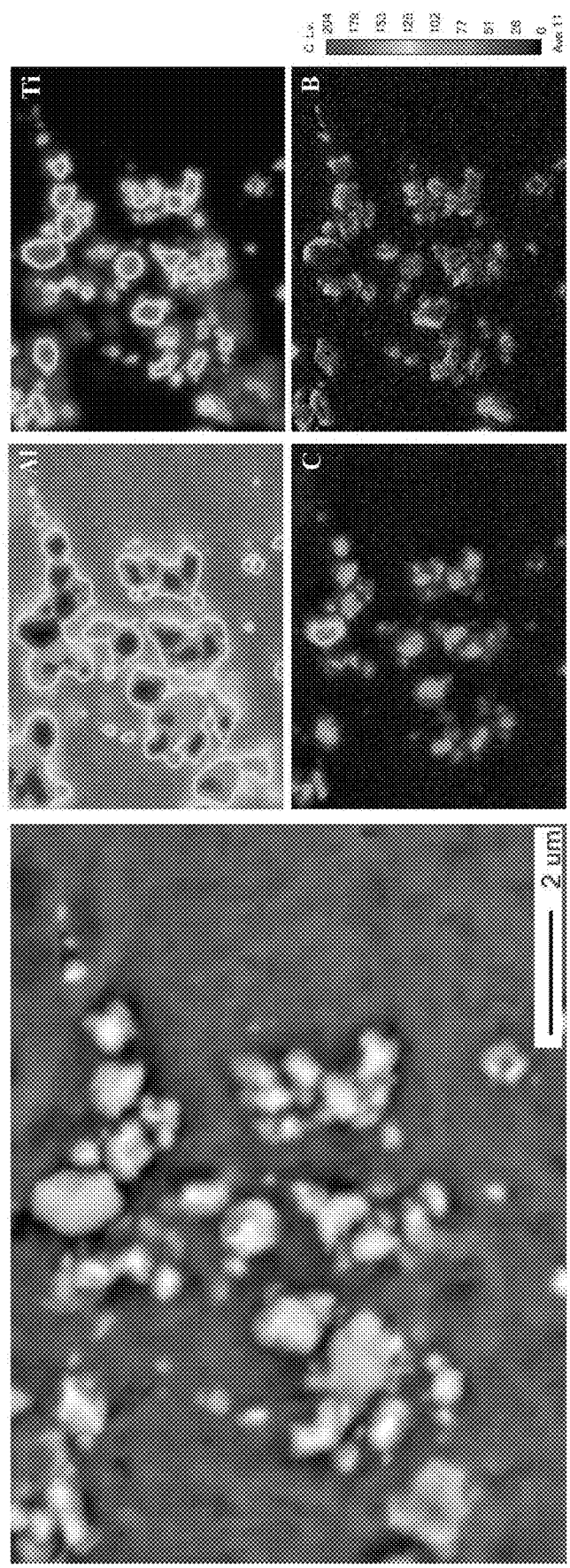
FIG. 2A is a microstructure of a TiCB—Al seed alloy according to an embodiment of the present disclosure.
FIG. 2B is an element content profile obtained by a surface scanning analysis of the microstructure of FIG. 2A.

FIG. 2A is a microstructure of a TiCB—Al seed alloy according to an embodiment of the present disclosure, and FIG. 2B is an element content distribution diagram obtained by a surface scanning analysis of the microstructure of FIG. 2A, showing the element content distribution at various positions in FIG. 2A. According to the element distribution in FIG. 2B, it can be seen that the element distribution of C and B in the core part and shell part of the TiC$_B$@TiBC seed crystal.

As shown in FIG. 2B, in the TiC$_B$@TiBC seed crystal, the C content in the core part is higher than the C content in the shell part, and the B content in the core part is lower than the B content in the shell part. In addition, even regarding the same TiC$_B$@TiBC seed crystal, the B contents in the shell part at different parts may be not uniform, and the thickness of the shell part at different parts may be not uniform. In addition, the shell part may completely coat the core part, or the shell part may only coat a part of the core part.

A Preparation Method of the TiCB—Al Seed Alloy

Hereinafter, a manufacturing method of the TiCB—Al seed alloy according to an embodiment of the present disclosure will be described. However, it should be understood that the TiCB—Al seed alloy according to the embodiment of the present disclosure is not limited by the manufacturing method described below, and the TiCB—Al seed alloy having the above-described TiC$_B$@TiBC (core@ shell) structure manufactured by other methods is also within the scope of protection of the present disclosure.

The method for manufacturing the TiCB—Al seed alloy according to the embodiment of the present disclosure includes: (1) preparing 0.64 wt % to 75.00 wt % of an Al—Al$_3$BC master alloy, 0.06 wt % to 7.77 wt % of a sponge titanium, and a balance of a commercial-purity aluminum, wherein a content of Al$_3$BC in the Al—Al$_3$BC master alloy is 3.0 wt % to 15.0 wt % of a total weight of the Al—Al$_3$BC master alloy; (2) melting the commercial-purity aluminum and the Al—Al$_3$BC master alloy and heating to 850° C. to 1300° C.; (3) adding the sponge titanium, and holding for 5 min to 60 min after the sponge titanium being dissolved to obtain a melt; (4) pouring the melt to obtain the TiCB—Al seed alloy.

In step (1), the Al—Al$_3$BC master alloy may comprise Al and Al$_3$BC, wherein Al$_3$BC in the Al—Al$_3$BC master alloy is 3.0 wt % to 15.0 wt % of the total weight of the Al—Al$_3$BC master alloy, and the balance may be Al. In addition, it should be understood that the Al—Al$_3$BC master alloy may also contain other impurity elements. As an example, the Al—Al$_3$BC master alloy may be an Al—Al$_3$BC master alloy produced by Shandong Al & Mg Melt Technology Co., Ltd., but the present disclosure is not limited thereto.

In addition, the content of titanium in the sponge titanium may be 99.5 wt %, and the content of aluminum in the commercial-purity aluminum may be 99.7 wt %, but the present disclosure is not limited thereto.

In step (2), the commercial-purity aluminum and the Al—Al$_3$BC master alloy are added to, for example, a furnace for melting and are heated to 850° C. to 1300° C. In step (3), the sponge titanium is added after the temperature is stable to react with Al$_3$BC. In order to dissolve the sponge titanium as soon as possible and promote the reaction, mechanical (or electromagnetic) stirring may be applied. The temperature is held for 5 min to 60 min after the sponge titanium is dissolved, so that the sponge titanium and Al$_3$BC can fully react.

In step (4), the fully reacted melt is casted into, for example, a cast iron mold to obtain the TiCB—Al seed alloy according to the embodiment of the present disclosure.

According to the embodiment of the present disclosure, alternatively, in step (1), the content of the Al—Al$_3$BC master alloy may be 2.1 wt % to 75.00 wt %, the content of the sponge titanium may be 0.2 wt % to 2.20 wt %, the heating temperature in step (2) may be 850° C. to 1100° C. and the holding time in step (3) may be 5 min to 40 min. Alternatively, in step (1), the content of the Al—Al$_3$BC master alloy may be 8.93 wt % to 75.00 wt %, the content of the sponge titanium may be 0.85 wt % to 3.5 wt %, the heating temperature in step (2) may be from 950° C. to 1200° C. and the holding time in step (3) may be 10 min to 45 min. Alternatively, in step (1), the content of the Al—Al$_3$BC master alloy may be 36.77 wt % to 75.00 wt %, the content of the sponge titanium may be 3.5 wt % to 7.77 wt %, the heating temperature in step (2) may be 1000° C. to 1300° C. and the holding time in step (3) may be 20 min to 60 min.

Hereinafter, two specific examples of the manufacturing method of the TiCB—Al seed alloy according to the present disclosure and the prepared TiCB—Al seed alloy will be described with reference to FIGS. 3 and 4.

Example 1

In Example 1, 30.0 wt % of Al-8.5Al$_3$BC master alloy, 1.75 wt % of sponge titanium and a balance of the commercial-purity aluminum are prepared. Wherein, Al-8.5Al$_3$BC master alloy means that Al$_3$BC accounts for 8.5 wt % of the total weight of Al-8.5Al$_3$BC master alloy. The commercial-purity aluminum and Al-8.5Al$_3$BC master alloy are melted in a furnace and heated to 950° C. After the temperature is stable, the sponge titanium is added, mechanical (or electromagnetic) stirring is applied to ensure that the sponge titanium is dissolved gradually and reacts with Al$_3$BC, and the temperature is held for 18 min. Then the melt obtained after the reaction is stirred evenly and poured into the cast iron mold to obtain the TiCB—Al seed alloy.

Figure 3:
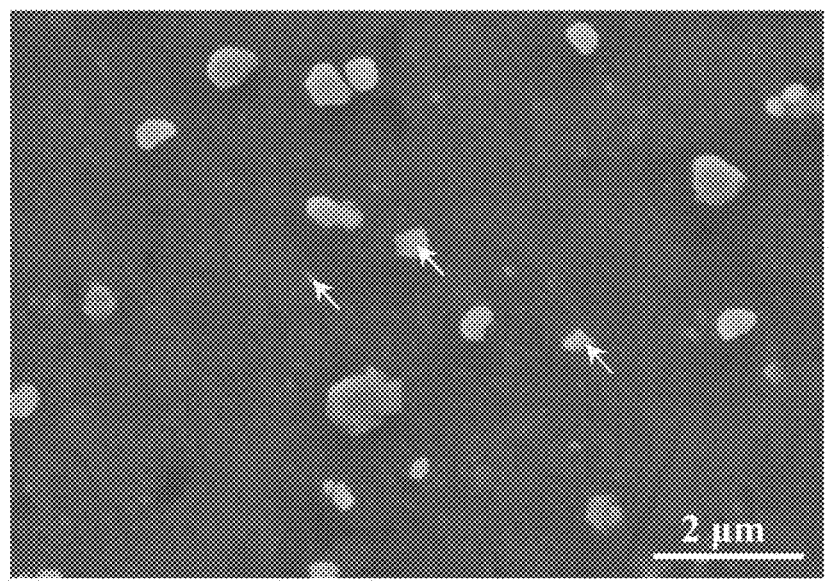
FIG. 3 is a microstructure illustrating a TiCB—Al seed alloy according to Example 1 of the present disclosure.

As shown in FIG. 3, in the TiCB—Al seed alloy prepared by Example 1, TiC$_B$@TiBC seed crystals (as indicated by arrows) are dispersed on the aluminum substrate, the TiC$_B$@TiBC seed crystals account for 2.3 wt % of the total weight of the TiCB—Al seed alloy, and diameters of the TiC$_B$@TiBC seed crystals are between 80 nm and 700 nm.

Example 2

In Example 2, 40.0 wt % of Al-5Al$_3$BC master alloy, 1.37 wt % of sponge titanium and a balance of the commercial-purity aluminum are prepared. Wherein, Al-5Al$_3$BC master alloy means that Al$_3$BC accounts for 5 wt % of the total weight of Al-5Al$_3$BC master alloy. The commercial-purity aluminum and Al-5Al$_3$BC master alloy are melted in a furnace and heated to 950° C. After the temperature is stable, the sponge titanium is added, mechanical (or electromagnetic) stirring is applied to ensure that the sponge titanium is dissolved gradually and reacts with Al$_3$BC, and the temperature is held for 15 min. Then the melt obtained after the reaction is stirred evenly and poured into the cast iron mold to obtain the TiCB—Al seed alloy.

Figure 4:
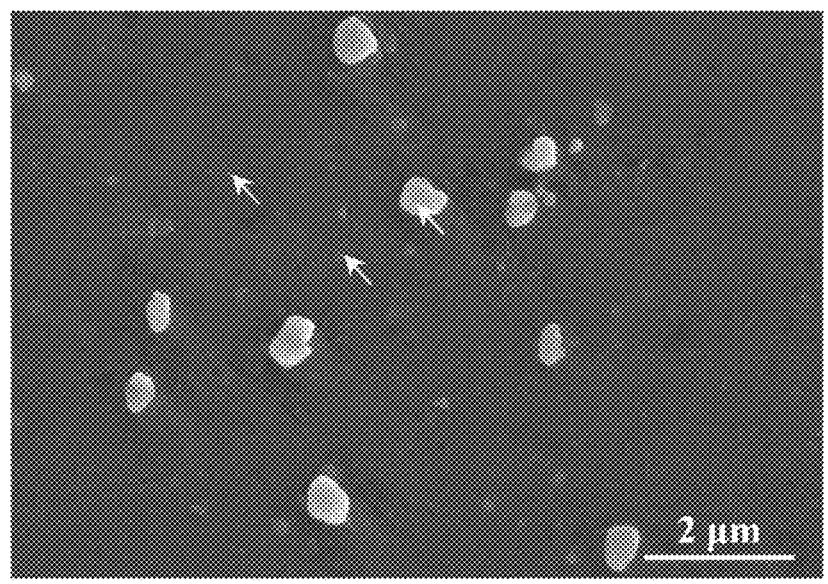
FIG. 4 is a microstructure illustrating a TiCB—Al seed alloy according to Example 2 of the present disclosure.

As shown in FIG. 4, in the TiCB—Al seed alloy prepared by Example 2, TiC$_B$@TiBC seed crystals (as indicated by arrows) are dispersed on the aluminum substrate, the TiC$_B$@TiBC seed crystals account for 1.81 wt % of the total weight of the TiCB—Al seed alloy, and diameters of the TiC$_B$@TiBC seed crystals are between 60 nm and 650 nm.

Hereinafter, a comparison result of the refinement of α-Al in A356 (Si-containing aluminum alloy) by using the TiCB—Al seed alloy according to the present disclosure and a conventional Al-5Ti-1B master alloy will be described with reference to FIG. 5.

Figure 5:
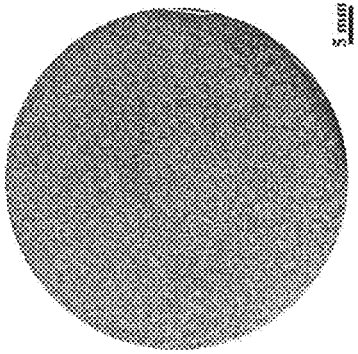
FIG. 5 is a comparison result illustrating the refinement of A356 using the TiCB—Al seed alloy according to the present disclosure and a conventional Al-5Ti-1B master alloy.

The TiCB—Al seed alloy shown in FIG. 5 is prepared according to Example 2 above, Ti content in the Al-5Ti-1B master alloy is 5 wt % of the total weight of Al-5Ti-1B master alloy, and B content in Al-5Ti-1B master alloy was 1 wt % of the total weight of Al-5Ti-1B master alloy.

In the refinement experiment of A356 using the TiCB—Al seed alloy according to the present disclosure and the conventional Al-5Ti-1B master alloy, the A356 is melted firstly, 0.1 wt % of the TiCB—Al seed alloy or 0.1 wt % of the Al-5Ti-1B master alloy is added at 720° C. and held for a certain time (as shown in FIG. 5), and then the refinement effects of the TiCB—Al seed alloy and the Al-5Ti-1B master alloy are tested by KBI ring mold method (standard measurement method known in the art).

As shown in FIG. 5, with the TiCB—Al seed alloy according to the present disclosure, α-Al exhibits an excellent refinement effect when holding for 5 min, and the refinement effect does not degrade when holding for 60 min, and the average grain size can be kept below 160 μm. On the contrary, using the traditional Al-5Ti-1B master alloy, the refinement effect of α-Al is bad when holding for 5 min and is obviously worse than the refinement effect of α-Al by using the TiCB—Al seed alloy under the same holding time. When holding for 30 min, although the traditional Al-5Ti-1B master alloy has certain refinement effect on α-Al, it is still worse than the refinement effect of α-Al by using the TiCB—Al seed alloy under the same holding time, and the refinement effect of α-Al degrades when holding for 60 min.

Therefore, the TiCB—Al seed alloy according to the present disclosure can solve the technical problem that the existing aluminum alloy refiner is prone to occur refinement "poisoning" caused by Si, and can achieve high-efficiency refinement without degradation for Al—Si series alloys.

In addition, the TiCB—Al seed alloy according to the present disclosure has low cost, excellent and stable refinement effect. In addition, since the TiCB—Al seed alloy according to the embodiment of the present disclosure contains an Al matrix, it can be added to an aluminum alloy at a relatively low temperature to refine α-Al, so that it is easy to be applied to a production site.

Although the application of the TiCB—Al seed alloy according to the present disclosure to A356 has been described above as an example, it should be understood that the TiCB—Al seed alloy according to the present disclosure can also be applied to other aluminum alloys (for example, 7050 ultra-high strength aluminum alloy and other Al—Si series alloys mentioned in the background) to refine α-Al, and a heritable aluminum alloy described below is also the case where the TiCB—Al seed alloy according to the present disclosure is applied to aluminum alloys to refine α-Al as crystal nucleus of α-Al.

A Heritable Aluminium Alloy

Hereinafter, a heritable aluminum alloy according to an embodiment of the present disclosure is described with reference to FIGS. 6A to 8B.

The heritable aluminum alloy according to the embodiment of the present disclosure includes α-Al and $TiC_B$@TiBC seed crystals using as seed crystals of α-Al and including a core part and a shell part, wherein the core part contains a B-doped $TiC_B$, and the shell part covers at least a part of the core part and contains a TiBC ternary phase, and wherein the B-doped $TiC_B$ refers to $TiC_B$ phase formed by B atoms occupying C vacancies in a $TiC_x$ crystal, and the TiBC ternary phase refers to a ternary phase composed of Ti, B, and C, where x<1.

Different from the existence form of the $TiC_B$@TiBC seed crystals dispersed on α-Al matrix in the TiCB—Al seed alloy, the $TiC_B$@TiBC seed crystals in the heritable aluminum alloy act as (basically act as due to the process error) the seed crystals of α-Al, rather than dispersing on the α-Al matrix.

Since the $TiC_B$@TiBC seed crystals have been described in detail above, detailed description will not be made herein in order to avoid redundancy.

According to the embodiment of the present disclosure, a content of the $TiC_B$@TiBC seed crystals may be 0.001 wt % to 5.120 wt % based on 100 wt % of the heritable aluminum alloy. Alternatively, the content of the $TiC_B$@TiBC seed crystals may be 0.001 wt % to 2.120 wt % based on 100 wt % of the heritable aluminum alloy. Alternatively, the content of the $TiC_B$@TiBC seed crystal may be 0.1 wt % to 1.0 wt % based on 100 wt % of the heritable aluminum alloy. Alternatively, the content of the $TiC_B$@TiBC seed crystals may be 2.0 wt % to 4.0 wt % based on 100 wt % of the heritable aluminum alloy. Alternatively, the content of the $TiC_B$@TiBC seed crystal may be 2.5 wt % to 5.120 wt % based on 100 wt % of the heritable aluminum alloy.

According to one embodiment of the present disclosure, the heritable aluminum alloy may be a heritable Al—Zn series alloy. Based on 100 wt % of the heritable Al—Zn series alloy, a content of Al may be 60.0 wt % to 98.9 wt %, a content of Zn may be 1.0 wt % to 10.0 wt %, and a content of Zr may be 0.0 wt % to 0.8 wt %. In addition, the heritable Al—Zn series alloy may further contain at least one of Mg, Cu, Si, Mn, Ni, Fe, Ti, and Cr.

According to the embodiment of the present disclosure, an average grain size of α-Al in the heritable Al—Zn series alloy measured using a TP-1 standard method (standard measurement method known in the art) is between 20 μm and 150 μm.

According to the embodiment of the present disclosure, an average grain size of α-Al in a casting obtained after remelting the heritable Al—Zn series alloy is smaller than the average grain size of α-Al in the heritable Al—Zn series alloy before remelting. This is because the $TiC_B$@TiBC seed crystals can be directly used as the nucleus of α-Al without assistance of $TiAl_3$ or a titanium-rich layer, which overcomes a poisoning influence of Zr element in the melt, so the casting obtained after remelting and casting have finer α-Al grain structure, even ultra-fine grain structure.

According to the embodiment of the present disclosure, the average grain size of α-Al in the casting obtained by remelting the heritable Al—Zn series alloy at 700° C. to 820° C. and holding for 15 min to 100 min is between 5 μm and 150 μm.

According to another embodiment of the present disclosure, the heritable aluminum alloy may be a heritable Al—Si series alloy. Based on 100 wt % of the heritable Al—Si series alloy, a content of Al may be 60.0 wt % to 99.5 wt %, and a content of Si may be 0.4 wt % to 13.0 wt %. In addition, the heritable Al—Si series alloy may further comprise at least one of Mg, Cu, Zn, Mn, Ni, Fe, Ti, Cr, and Zr.

According to the embodiment of the present disclosure, an average grain size of α-Al in the heritable Al—Si series alloy measured using the KBI ring mold method or the TP-1 standard method is between 35 μm and 250 μm.

According to the embodiment of the present disclosure, an average grain size of α-Al in a casting obtained after remelting the heritable Al—Si series alloy is smaller than the average grain size of α-Al in the heritable Al—Si series alloy before remelting. This is because the TiC$_B$@TiBC seed crystals can be directly used as the nucleus of α-Al without assistance of TiAl$_3$ or a titanium-rich layer, which overcomes a poisoning influence of Si element in the melt, so the casting obtained after remelting have finer α-Al grain structure, even ultra-fine grain structure.

According to the embodiment of the present disclosure, the average grain size of α-Al in the casting obtained after remelting the heritable Al—Si series alloy at 680° C. to 820° C. and holding for 15 min to 180 min is between 5 μm and 200 μm.

Although the heritable Al—Zn series alloy and the heritable Al—Si series alloy have been described above as two specific examples of the heritable aluminum alloys, the present disclosure is not limited thereto. The heritable aluminum alloy of the present disclosure may also comprise other series of aluminum alloys.

In addition, the heritable aluminum alloy according to the present disclosure can be manufactured by melting a corresponding proportion of pure aluminum and the TiCB—Al seed alloy to a certain temperature (for example, 700° C. to 850° C.) in a holding furnace or an induction furnace, adding raw materials corresponding to elements contained in corresponding heritable aluminum alloy to be completely dissolved, and pouring to obtain the heritable aluminum alloy according to the present disclosure.

According to the present disclosure, when the heritable aluminum alloy (for example, the heritable Al—Zn series alloy or the heritable Al—Si series alloy), for example, having ultra-fine grain, prepared by using the TiCB—Al seed alloy is applied to industrial production, it is only need to remelt the heritable aluminum alloy of the present disclosure and it is not need to add a refiner or perform a melt treatment technology related to grain refinement (for example, it is not need to add the TiCB—Al seed alloy according to the present disclosure to the aluminum alloy for refinement treatment), and a casting obtained by remelting the heritable aluminum alloy of the present disclosure can obtain an ultra-fine grain structure, and thus the heritable aluminum alloy of the present disclosure can be simply and efficiently applied to industrial production.

Hereinafter, three specific examples of the heritable aluminum alloy according to the present disclosure are described.

Example 3

Figure 6B:
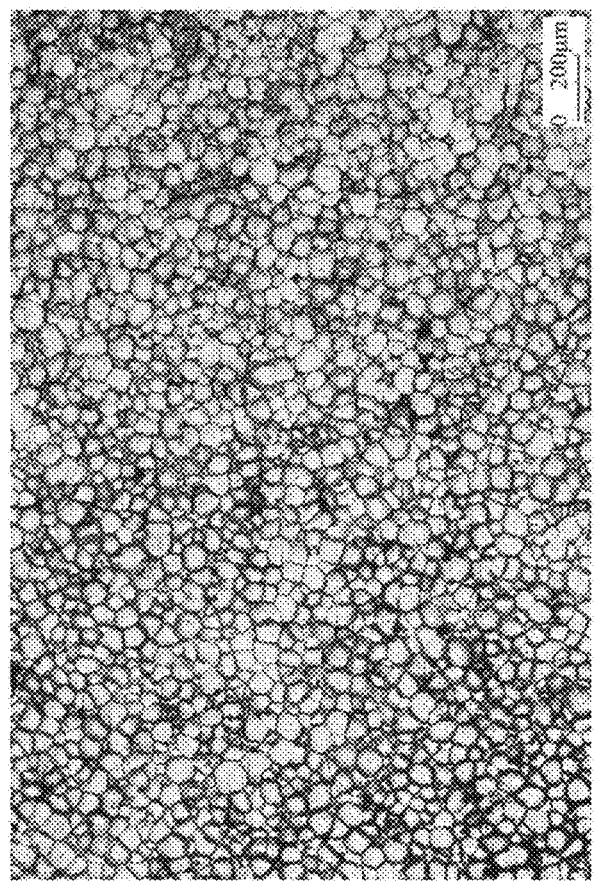
FIG. 6B is a microscopic grain structure of a casting obtained after remelting the heritable Al—Zn series alloy of FIG. 6A.
Figure 6A:
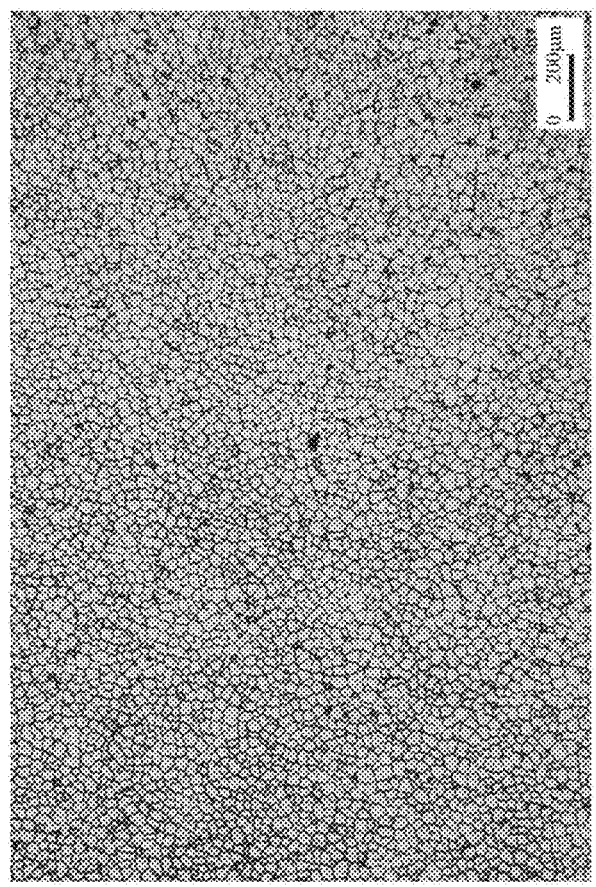
FIG. 6A is a microscopic grain structure of a heritable Al—Zn series alloy according to Example 3 of the present disclosure.

FIG. 6A shows a microscopic grain structure of a heritable Al—Zn series alloy according to Example 3, and FIG. 6B shows a microscopic grain structure of a casting obtained after remelting the heritable Al—Zn series alloy of FIG. 6A.

The heritable Al—Zn series alloy according to Example 3 includes 6.0 wt % of Zn, 0.15 wt % of Zr, 2.3 wt % of Mg, 2.2 wt % of Cu, 0.12 wt % of Si, 0.15 wt % of Fe, 0.1 wt % of Mn, 0.06 wt % of Ti, 0.04 wt % of Cr, 0.8 wt % of TiC$_B$@TiBC seed crystal and a balance of Al. An average grain size of α-Al in an as-cast alloy measured by the TP-1 standard method is 39 μm, as shown in FIG. 6A.

An average grain size of α-Al in an alloy casting obtained by remelting the heritable Al—Zn series alloy of FIG. 6A at 750° C. and holding for 60 min is 25 μm, that is to say, the alloy casting has finer grain structure and obtains ultra-fine grain structure, as shown in FIG. 6B.

In addition, the heritable Al—Zn series alloy in Example 3 contains Zr, and even in this case, the heritable Al—Zn series alloy can obtain an ultra-fine grain structure with the average grain size of 25 μm after remelting and holding for 60 min (a relatively long holding time). Therefore, it can be confirmed by Example 3 that the TiCB—Al seed alloy according to the present disclosure can solve the technical problem that the existing aluminum alloy refiner is prone to occur refinement "poisoning" caused by Zr, and can realize efficient refinement of Zr-containing aluminum alloy without degradation (the heritable Al—Zn series alloy may still have an ultra-fine grain structure after holding for 60 min and thus the refinement effect does not degrade).

Example 4

Figures 7A, 7B, 7C:
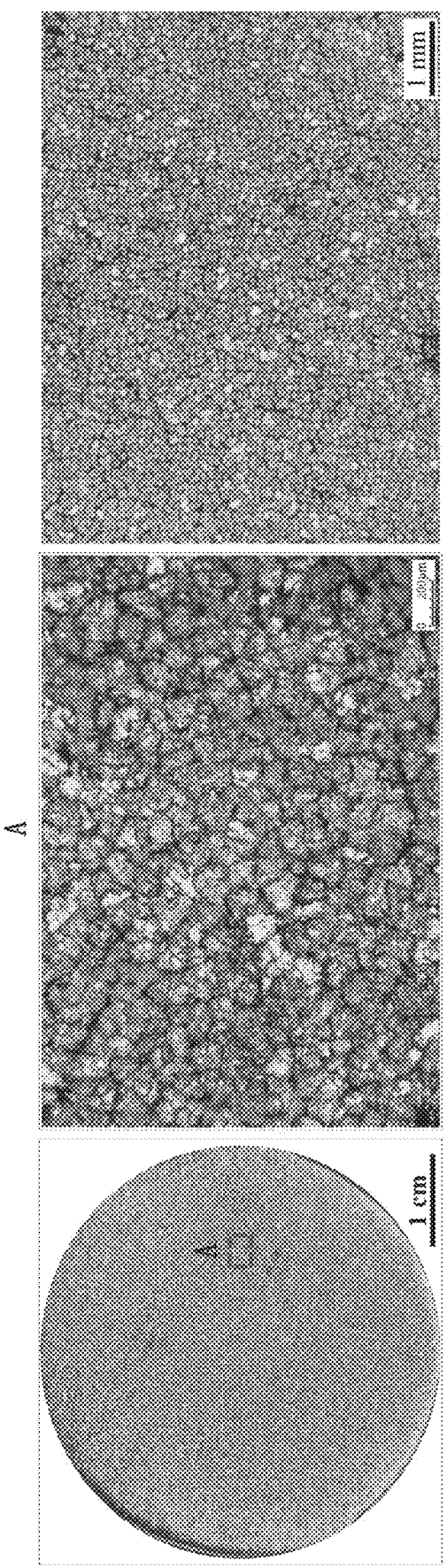
FIG. 7A is a macroscopic grain structure of a heritable Al—Si series alloy according to Example 4 of the present disclosure.
FIG. 7B is a microscopic grain structure of part A of FIG. 7A.
FIG. 7C is a microscopic grain structure of a casting obtained after remelting the heritable Al—Si series alloy of FIG. 7A.

FIG. 7A is a macroscopic grain structure of a heritable Al—Si series alloy according to Example 4 of the present disclosure, FIG. 7B is a microscopic grain structure of part A of FIG. 7A, and FIG. 7C is a microscopic grain structure of a casting obtained after remelting the heritable Al—Si series alloy of FIG. 7A.

The heritable Al—Si series alloy according to Example 4 includes 6.5 wt % of Si, 0.4 wt % of Mg, 0.01 wt % of TiC$_B$@TiBC seed crystals, and a balance of Al. An average grain size of α-Al in an as-cast alloy measured by the KBI ring mold method is 123 μm, as shown in FIG. 7B.

An average grain size of α-Al in an alloy casting obtained by remelting the heritable Al—Si alloy of FIG. 7A at 700° C. and holding for 120 min is 84 μm, that is to say, the alloy casting has finer grain structure and obtains ultra-fine grain structure, as shown in FIG. 7C.

Example 5

Figure 8B:
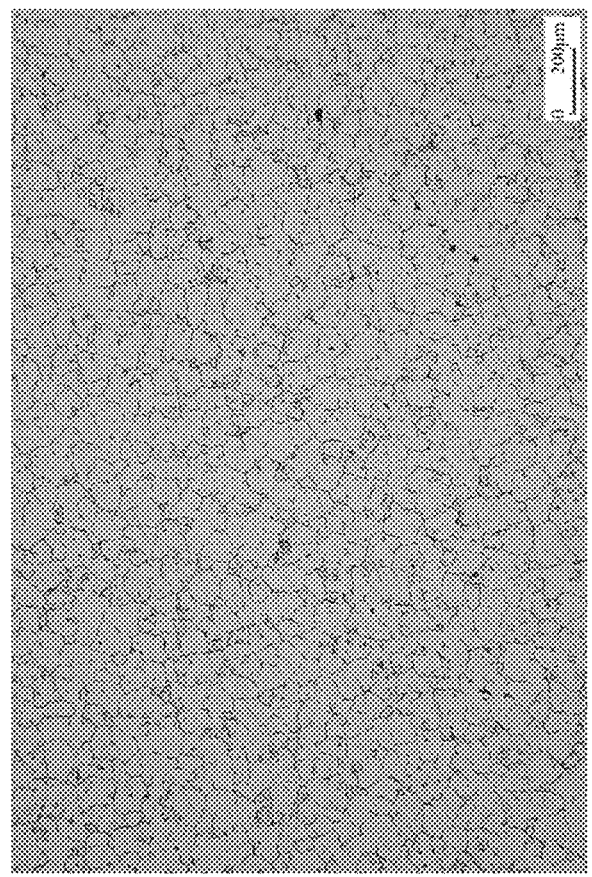
FIG. 8B is a microscopic grain structure of a casting obtained after remelting the heritable Al—Si series alloy of FIG. 8A.
Figure 8A:
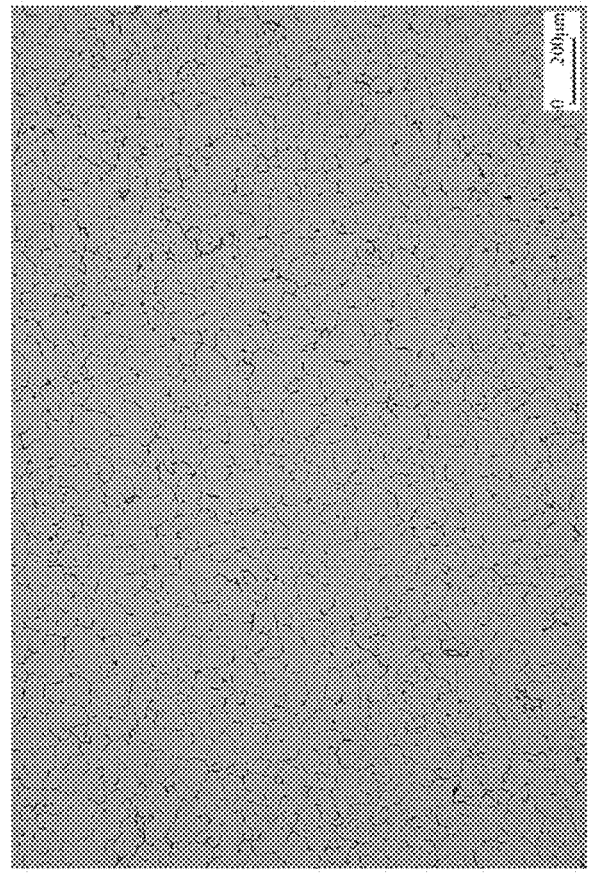
FIG. 8A is a microscopic grain structure of a heritable Al—Si series alloy according to Example 5 of the present disclosure.

FIG. 8A is a macroscopic grain structure of a heritable Al—Si series alloy according to Example 5 of the present disclosure, and FIG. 8B is a macroscopic grain structure of a casting obtained after remelting the heritable Al—Si series alloy of FIG. 8A.

The heritable Al—Si series alloy according to Example 5 includes 0.8 wt % of Si, 1.0 wt % of Mg, 0.25 wt % of Cu, 0.6 wt % of Fe, 0.25 wt % of Zn, 0.15 wt % of Mn, 0.15 wt % of Ti, 0.2 wt % of Cr, 0.008 wt % of TiC$_B$@TiBC seed crystals, and a balance of Al. An average grain size of α-Al in an as-cast alloy measured by the TP-1 standard method is 79 μm, as shown in FIG. 8A.

An average grain size of α-Al in an alloy casting obtained by remelting the heritable Al—Si alloy of FIG. 8A at 715° C. and holding for 100 min is 62 μm, that is to say, the alloy casting has finer grain structure and obtains ultra-fine grain structure, as shown in FIG. 8B.

According to the heritable Al—Si series alloys of Examples 4 and 5, even after remelting and holding for 120 min (Example 4) or 100 min (Example 5), an ultra-fine grain structure with an average grain size of 84 μm (Example 4) or 62 μm (Example 5) of α-Al can be obtained. Therefore, it can be confirmed by Examples 4 and 5 that the TiCB—Al seed alloy according to the present disclosure can solve the technical problem that the existing aluminum alloy refiner is prone to occur refinement "poisoning" caused by Si, and can realize efficient refinement of Si-containing aluminum alloy without degradation (the heritable Al—Si series alloy may still have an ultra-fine grain structure after holding for a relatively long time (120 min or 100 min) and thus the refinement effect does not degrade).

According to the embodiments of the present disclosure described above, the following technical effects can be achieved, but the technical effects are not limited thereto.

According to the present disclosure, the TiCB—Al seed alloy can solve the technical problem that the existing aluminum alloy refiner is prone to occur refinement "poisoning" caused by Zr and Si, can realize efficient refinement of Zr-containing or Si-containing aluminum alloy without degradation, and the fine grain structure of the refined aluminum alloy can be inherited after remelting.

According to the present disclosure, the TiCB—Al seed alloy has low cost and has excellent and stable refinement effect. In addition, since the TiCB—Al seed alloy according to the embodiment of the present disclosure contains an Al matrix, it can be added to an aluminum alloy at a relatively low temperature to refine α-Al, so that it is easy to be applied to a production site.

According to the present disclosure, when the heritable aluminum alloy (for example, the heritable Al—Zn series alloy or the heritable Al—Si series alloy), for example, having ultra-fine grain, prepared by using the TiCB—Al seed alloy is applied to industrial production, it is only need to remelt the heritable aluminum alloy of the present disclosure and it is not need to add a refiner or perform a melt treatment technology related to grain refinement, and a casting obtained by remelting and casting the heritable aluminum alloy of the present disclosure can obtain an ultra-fine grain structure, and thus the heritable aluminum alloy of the present disclosure can be simply and efficiently applied to industrial production.

Although some embodiments of the present disclosure have been shown and described, those skilled in the art should appreciate that modifications may be made to these embodiments without departing from the principles and spirit of the present disclosure, the scope of which is defined by the claims and their equivalents.

What is claimed is:

1. A TiCB—Al seed alloy, comprising an Al matrix and a plurality of $TiC_B$@TiBC seed crystals dispersed on the Al matrix, wherein each $TiC_B$@TiBC seed crystal comprises a core part and a shell part, the core part contains B-doped $TiC_B$, and the shell part covers at least a part of the core part and contains a TiBC ternary phase, wherein the B-doped $TiC_B$ refers to a $TiC_B$ phase formed by B atoms occupying C vacancies in a $TiC_x$ crystal, and the TiBC ternary phase refers to a ternary phase composed of Ti, B and C, wherein x<1.

2. The TiCB—Al seed alloy of claim 1, wherein a content of C in the core part is higher than a content of C in the shell part, and a content of B in the core part is lower than a content of B in the shell part.

3. The TiCB—Al seed alloy of claim 1, wherein the B-doped $TiC_B$ is represented by $TiC_xB_y$, wherein 0.72<x<0.81, and 0<y<0.17.

4. The TiCB—Al seed alloy of claim 1, wherein a content of the plurality of $TiC_B$@TiBC seed crystals is 0.08 wt % to 10.24 wt % based on 100 wt % of the TiCB—Al seed alloy.

5. The TiCB—Al seed alloy of claim 4, wherein a content of Ti is 0.06 wt % to 7.77 wt %, a content of C is 0.01 wt % to 1.30 wt %, and a content of B is 0.01 wt % to 1.17 wt % based on 100 wt % of the TiCB—Al seed alloy.

6. The TiCB—Al seed alloy of claim 1, wherein a morphology of each $TiC_B$@TiBC seed crystal is different from those of a hexagonal sheet-like $TiB_2$ crystal and an octahedral-like or tetrahedral-like $TiC_x$ crystal.

7. The TiCB—Al seed alloy of claim 6, wherein each $TiC_B$@TiBC seed crystal is generally spherical and a diameter of the $TiC_B$@TiBC seed crystal is between 50 nm and 800 nm.

8. A method of manufacturing a TiCB—Al seed alloy, comprising:
(1) preparing 0.64 wt % to 75.00 wt % of an Al—$Al_3BC$ master alloy, 0.06 wt % to 7.77 wt % of a sponge titanium, and a balance of a commercial-purity aluminum, wherein a content of $Al_3BC$ in the Al—$Al_3BC$ master alloy is 3.0 wt % to 15.0 wt % of a total weight of the Al—$Al_3BC$ master alloy;
(2) melting the commercial-purity aluminum and the Al—$Al_3BC$ master alloy and heating to 850° C. to 1300° C.;
(3) adding the sponge titanium, and holding for 5 min to 60 min after the sponge titanium being dissolved to obtain a melt; and
(4) pouring the melt to obtain the TiCB—Al seed alloy of claim 1.

9. An aluminum alloy, comprising α-Al and a plurality of $TiC_B$@TiBC seed crystals, each $TiC_B$@TiBC seed crystal having a core part and a shell part, wherein the core part contains a B-doped $TiC_B$, and the shell part covers at least a part of the core part and contains a TiBC ternary phase, and wherein the B-doped $TiC_B$ refers to $TiC_B$ phase formed by B atoms occupying C vacancies in a $TiC_x$ crystal, and the TiBC ternary phase refers to a ternary phase composed of Ti, B, and C, where x<1.

10. The aluminum alloy of claim 9, wherein a content of the plurality of $TiC_B$@TiBC seed crystals is 0.001 wt % to 5.120 wt % based on 100 wt % of the aluminum alloy,
the aluminum alloy is an Al—Zn series alloy, and a content of Al is 60.0 wt %-98.9 wt %, a content of Zn is 1.0 wt %-10.0 wt %, and a content of Zr is 0.0 wt %-0.8 wt % based on 100 wt % of the heritable Al—Zn series alloy.

11. The aluminum alloy of claim 9, wherein a content of the plurality of $TiC_B$@TiBC seed crystals is 0.001 wt % to 5.120 wt % based on 100 wt % of the aluminum alloy,
the aluminum alloy is a heritable an Al—Si series alloy, and a content of Al is 60.0 wt %-99.5 wt %, and a content of Si is 0.4 wt %-13.0 wt % based on 100 wt % of the Al—Si series alloy.

12. The aluminum alloy of claim 10, wherein an average grain size of α-Al in the Al—Zn series alloy measured by a TP-1 standard method is between 20 μm and 150 μm.

13. The aluminum alloy of claim 11, an average grain size of α-Al in the Al—Si series alloy measured by a KBI ring mold method or the TP-1 standard method is between 35 μm and 250 μm.

14. The aluminum alloy of claim 12, wherein an average grain size of α-Al in a casting obtained after remelting the Al—Zn series alloy is smaller than the average grain size of α-Al in the heritable Al—Zn series alloy before remelting.

15. The aluminum alloy of claim 13, wherein an average grain size of α-Al in a casting obtained after remelting the Al—Si series alloy is smaller than the average grain size of α-Al in the Al—Si series alloy before prior to remelting.

16. The aluminum alloy of claim 14, wherein the average grain size of α-Al in the casting obtained by remelting the Al—Zn series alloy at 700° C. to 820° C. and holding for 15 min to 100 min is between 5 μm and 150 μm.

17. The aluminum alloy of claim 15, wherein the average grain size of α-Al in the casting obtained after remelting the Al—Si series alloy at 680° C. to 820° C. and holding for 15 min to 180 min is between 5 μm and 200 μm.

* * * * *